United States Patent
Slosarczyk et al.

(10) Patent No.: US 10,150,460 B2
(45) Date of Patent: Dec. 11, 2018

(54) METHOD FOR DETERMINING THE CHARGE IN A VEHICLE BATTERY

(71) Applicant: Jaguar Land Rover Limited, Coventry (GB)

(72) Inventors: Krzysztof Slosarczyk, Coventry (GB); Fernando Lages, Coventry (GB); Kevin Cockings, Coventry (GB); Stephen Pickering, Coventry (GB); Jakub Mikos, Coventry (GB)

(73) Assignee: Jaguar Land Rover Limited, Coventry, Warwickshire (GB)

( * ) Notice: Subject to any disclaimer, the term of this patent is extended or adjusted under 35 U.S.C. 154(b) by 67 days.

(21) Appl. No.: 14/426,200

(22) PCT Filed: Sep. 3, 2013

(86) PCT No.: PCT/EP2013/068140
§ 371 (c)(1),
(2) Date: Mar. 5, 2015

(87) PCT Pub. No.: WO2014/040879
PCT Pub. Date: Mar. 20, 2014

(65) Prior Publication Data
US 2015/0232081 A1    Aug. 20, 2015

(30) Foreign Application Priority Data
Sep. 11, 2012   (GB) .................... 1216127.9

(51) Int. Cl.
*B60W 10/26*   (2006.01)
*G01R 31/36*   (2006.01)
*B60W 10/06*   (2006.01)

(52) U.S. Cl.
CPC ............ *B60W 10/26* (2013.01); *B60W 10/06* (2013.01); *G01R 31/3606* (2013.01);
(Continued)

(58) Field of Classification Search
CPC .. B60W 10/26; B60W 10/06; B60W 2510/06; B60W 2510/244; B60W 2710/248; G01R 31/3648; G01R 31/3606
See application file for complete search history.

(56) References Cited

U.S. PATENT DOCUMENTS

| 5,488,283 A | 1/1996 | Dougherty et al. |
| 2010/0019729 A1 | 1/2010 | Kaita et al. |
| 2010/0253284 A1* | 10/2010 | Aoki ................... H01M 10/441 320/118 |

FOREIGN PATENT DOCUMENTS

| CN | 101682202 A | 3/2010 |
| EP | 2 154 764 A1 | 2/2010 |

(Continued)

OTHER PUBLICATIONS

Notification of the First Office Action, Chinese Patent Application No. 201380047354.5, dated Aug. 2, 2016, 18 pages.
(Continued)

*Primary Examiner* — Jelani A Smith
*Assistant Examiner* — Kelly D Williams
(74) *Attorney, Agent, or Firm* — Myers Bigel, P.A.

(57) ABSTRACT

A method for determining the charge in a battery which comprises providing a main battery and a auxiliary battery. The method then comprises connecting the main battery to an electrical load; measuring $I_1$, the current drawn from the main battery while it is connected to the electrical load; connecting the auxiliary battery in parallel with the main battery and the electrical load; measuring $I_2$, the current drawn from the main battery while it is connected to the electrical load and the auxiliary battery; and estimating the state of charge in the auxiliary battery based upon at least the difference between $I_1$ and $I_2$.

16 Claims, 2 Drawing Sheets

(52) U.S. Cl.
CPC ..... *G01R 31/3648* (2013.01); *B60W 2510/06* (2013.01); *B60W 2510/244* (2013.01); *B60W 2710/248* (2013.01)

(56) References Cited

FOREIGN PATENT DOCUMENTS

| EP | 2 246 956 A1 | 11/2010 |
|---|---|---|
| EP | 2 390 982 A1 | 11/2011 |
| JP | 2008-276970 A | 11/2008 |
| JP | 2010-036280 | 2/2010 |
| JP | 2011-246114 | 12/2011 |

OTHER PUBLICATIONS

International Search Report, PCT/EP2013/068140, dated Jan. 27, 2014, 3 pages.
Combined Search and Examination Report, Application No. GB1216127.9, dated Jan. 14, 2013, 6 pages.
Notice of Preliminary Rejection, Korean Patent Application No. 10-2015-7007280, dated Apr. 28, 2017, 5 pages.

\* cited by examiner

METHOD FOR DETERMINING THE CHARGE IN A VEHICLE BATTERY

RELATED APPLICATIONS

This application is a 35 U.S.C. § 371 national stage application of PCT Application No. PCT/EP 2013/068140, filed on Sep. 3, 2013, which claims priority from Great Britain Patent Application No. 1216127.9, filed on Sep. 11, 2012, the contents of which are incorporated herein by reference in their entireties. The above-referenced PCT International Application was published in the English language as International Publication No. WO 2014/040879 A1 on Mar. 20, 2014.

FIELD OF THE INVENTION

This invention relates to a method for determining the charge in a vehicle battery.

BACKGROUND

Due to concerns over fuel use, it has become imperative for automotive manufacturers to adopt an ecologic mindset. In this mindset efficiency plays a predominant role when developing new vehicle systems. A new car must waste as little fuel as is practical, hence increasing the mileage that the car achieves, and so reducing the cost of running the vehicle and its environmental impact.

One particular feature that can be introduced to minimize the use of fossil fuels is a stop start system. A stop start system automatically shuts down the engine in a car when it is not in use, and starts it again as soon as it is required. The shutdown in a stop start system is not a full shutdown, but a partial shutdown which allows the engine to restart promptly when needed. By using a stop start system when a car is idling, for example at traffic lights, fuel consumption can be reduced. Similar systems are frequently used in hybrid vehicles, where they can be used even if the car is not stationary. For example, the internal combustion engine may not be employed during low power uses of the vehicle and while the high voltage battery system has sufficient power to drive the vehicle. A stop start system can also be used in purely internal combustion engine driven vehicles to conserve fuel during stationary idling.

One major problem which must be overcome in a stop start vehicle is how to imperceptibly re-crank the engine, starting the engine again when it is required. Re-cranking the engine requires considerable power from the primary battery in the car, typically a 12 volt battery, and as such re-cranking can cause a drop in the voltage available to other systems. This can cause control modules to reset and other faults to arise. If a vehicle is completely shut down before start up, (e.g. when an ignition system is disabled) these problems do not arise since any fault codes which arise due to a voltage drop during the initial crank are not logged. These fault codes can be safely ignored since the initial crank is not a safety critical scenario. However once the vehicle has been driven, and during a re-crank, similar errors cannot be ignored. Therefore many systems in the vehicle require a reliable voltage to continue functioning, and to prevent inaccurate faults being logged. These systems may include control components, and in particular engine management systems require a reliable voltage and will generally go into shut down when a predetermined voltage reduction has occurred. Since several of the electrical systems in a car are safety critical, it is vital that a reliable voltage is provided. Safety critical systems include some braking systems, stability control etc. If the car is a hybrid it may still move while the engine is turned off, and steering systems may therefore be safety critical as well.

It is also important to perform a re-crank without an audible or visible drawback for the driver, such as the lights dimming, or the volume of a radio dropping, or any similar effect.

To tackle this issue, a new hardware layout has been designed in which two batteries, typically 12V each, are connected in parallel. International patent application PCT/EP2012/051484 describes one such system. In a two battery system, the auxiliary battery can be used to support control modules and other systems while the main battery is used to re-crank the engine. This requires a control system that isolates the main battery from the vehicle systems during re-crank, otherwise the effect of two batteries may be lost.

In a conventional vehicle with a stop start system, the auxiliary battery is only used briefly, during a re-crank. It is desirable that the auxiliary battery is not cycled significantly, so that it lasts a long time before requiring replacement.

In a hybrid vehicle, in contrast, it is typically desirable to isolate the main battery from the remainder of the electrical system for as long as the internal combustion engine is turned off. Hence the 12V auxiliary battery is used whenever the hybrid is in an electric mode, relying upon a high voltage battery driven motor rather than an internal combustion engine. Hybrid vehicles often have at least three batteries, two of which are 12V batteries and one of which is a 300V battery.

It is suggested in PCT/EP2012/051484 to isolate the auxiliary battery during normal operation to avoid this cycling problem, and this is achieved by a switch which isolates the auxiliary battery from the other electrical components of the vehicle. However, it is necessary to keep the auxiliary battery at full charge to avoid deterioration, and to ensure that the battery is ready for use by the stop start system.

Typically, the battery in a conventional vehicle is monitored for its condition via signals obtained from a Battery Monitoring System (BMS), which measures the battery temperature, battery voltage and battery current. With this information, the BMS derives the battery's State Of Charge (SOC), so that the battery can be charged as necessary.

For a car with two batteries, the attributes of the auxiliary battery also require measurement if that battery is to be used properly. In particular, the performance of the auxiliary battery (and in turn the performance of any system which relies upon the auxiliary battery during a re-crank) depends upon the auxiliary battery's SOC. For this reason another BMS module, attached to the auxiliary battery, can be utilised to determine the SOC. However, BMS modules are expensive, and fitting an additional one increases the cost of manufacture. Therefore, if the estimation of the auxiliary battery SOC could be realised without the use of a second BMS module, this would result in a cost saving.

BRIEF SUMMARY OF THE INVENTION

In accordance with one aspect of the present invention there is provided a method and system for determining the state of charge in a battery. The method comprises providing a main battery and an auxiliary battery. The method comprises connecting the main battery to an electrical load; measuring $I_1$, the current drawn from the main battery while it is connected to the electrical load; connecting the auxiliary battery in parallel with the main battery and the electrical load; measuring $I_2$, the current drawn from the main battery while it is connected to the electrical load and the auxiliary battery; and estimating the state of charge in the auxiliary battery based upon at least the difference between $I_1$ and $I_2$.

In this way the method estimates the state of charge of the auxiliary battery from the magnitude of a discharge current from that battery. The state of charge in the auxiliary battery can therefore be estimated without having to take direct measurements from the auxiliary battery. Instead, the estimate can be derived using only equipment, such as a Battery Monitoring System (BMS), which is attached to the main battery. No dedicated monitoring equipment needs to be attached to the auxiliary battery, therefore avoiding the expense of a second BMS, or a dedicated current sensor. In addition, the electrical load is provided with power throughout, meaning that electrical systems within a vehicle employing such a method will continue to operate, including safety critical systems such as braking systems. The method may be used in a vehicle, wherein the vehicle comprises the main battery, the auxiliary battery and the electrical load.

One major advantage of this method is that the performance of the battery is being examined under the load. This means that the test can be carried out during normal operation of a car incorporating the system. Since the results of the method are not safety critical and a failure will typically cause only a charging cycle for the battery, a successful pass of the test indicates robustly that the battery is capable of providing a power supply when required.

Estimating the charge of the battery may comprise deriving a value associated with the state of charge of the battery. Alternatively, estimating the charge of the battery may comprise determining where the state of charge of the battery lies in relation to one or more threshold levels.

It may be that the method comprises: taking a plurality of measurements of $I_1$ and $I_2$; and deriving a plurality of estimates of the state of charge in the auxiliary battery using the plurality of measurements of $I_1$ and $I_2$.

As the size of the electrical load may vary with time, it may change between the measurement of $I_1$ and the measurement of $I_2$. Performing multiple checks can help to compensate for this source of error. The method may comprise taking an average of the plurality of the estimates of the state of charge, and using the average state of charge to determine if the auxiliary battery needs to undergo a charging cycle.

The method may comprise classifying each estimate of the state of charge as indicating either that the battery is above a predetermined threshold charge or that the battery is below that threshold charge. The method may then comprise charging the battery once a predetermined number of estimates indicate that the battery is below the threshold charge. The method may also or alternatively comprise ending the method once a predetermined number of estimates indicate that the battery is above the threshold charge.

It may be that the method comprises: determining the temperature of the main battery; and estimating the state of charge in the auxiliary battery based upon at least the difference between $I_1$ and $I_2$, and the temperature of the main battery.

Similarly, it may be that method comprises: determining the temperature of the auxiliary battery; and estimating the state of charge in the auxiliary battery based upon at least the difference between $I_1$ and $I_2$, and the temperature of the auxiliary battery.

In this way the method estimates the state of charge of the auxiliary battery from the magnitude of a discharge current from that battery with respect to known conditions such as temperature. Determining the temperature of either battery may comprise measuring the temperature directly using a sensor such as a thermistor. Alternatively, determining the temperature of the either battery may comprise using a thermal model to calculate an estimated temperature. The estimated temperature may be based upon variables such as the temperature in other locations in the vehicle (when the system is in a vehicle), the ambient temperature, and how long the car has been operating. In a particular embodiment, the temperature of the main battery may be measured by a BMS, and the temperature of the auxiliary battery may be estimated using a thermal model.

The method may comprise initiating a charging cycle for the auxiliary battery if the estimated state of charge in the auxiliary battery is beneath a predetermined level.

The method may comprise: first determining the size of the electrical load; and interrupting the method if the electrical load is beneath a predetermined threshold load. Once the method has been interrupted, the method may comprise restarting the method if the load rises above a predetermined threshold. Alternatively, the method may comprise: first determining the size of the electrical load; and increasing the size of the electrical load if it is beneath a predetermined minimum.

The method may comprise: determining the size of the electrical load while carrying out the method; and interrupting the method if the electrical load exceeds a predetermined maximum.

The size of the electrical load may be determined by a direct measurement, or it may be estimated, for example by identifying which electrical systems are active, and deriving an estimate based upon each system's typical electrical load.

The method may comprise deactivating a third power source while the measurements are made, such as an alternator or a DC/DC converter, in order that the third power source does not alter the electrical characteristics of the vehicle in unpredictable ways. As is well known, an alternator is employed in vehicles with internal combustion engines to charge batteries and a DC/DC converter is used especially in hybrid vehicles where the electric motor may be running at a higher voltage than normal vehicle systems and the power source is set up accordingly. In addition, deactivating the third power source may serve to increase the current draw from the main battery and the auxiliary battery, which will tend to make the results of the method more reliable.

The method may comprise: providing a table which relates the difference between $I_1$ and $I_2$ with the state of charge in the auxiliary battery; and using the table to estimate the state of charge in the auxiliary battery.

Alternatively, $I_1$ and $I_2$ may be related to the state of charge in the battery by an equation.

The method may comprise: calculating the current contribution ratio C, where $C=I_2/(I_1-I_2)$; and estimating the state of charge in the auxiliary battery based upon at least the value of C.

Estimating the state of charge in the auxiliary battery may comprise comparing C to a threshold value of C.

The invention also extends to a method of calibrating a table used in the method described above, the calibration method comprising: not charging or discharging the auxiliary battery for a predetermined period of time; measuring the voltage across the terminals of the auxiliary battery; estimating the state of charge in the auxiliary battery based upon at least the voltage across the terminals; estimating the state of charge in the auxiliary battery using a method as described above; comparing the two estimates; and amending the table so that the two estimates are the same.

Where an equation is used instead of a table, the equation can be calibrated by: not charging or discharging the auxiliary battery for a predetermined period of time; measuring the voltage across the terminals of the auxiliary battery; estimating the state of charge in the auxiliary battery based upon at least the voltage across the terminals; estimating the state of charge in the auxiliary battery using a method as described above; comparing the two estimates; and amending at least one constant in the equation so that the two estimates are the same.

In either of the two calibration methods described above, the auxiliary battery may be isolated from other electrical components such as the load while the voltage across the terminals of the auxiliary battery is measured. This can help to prevent charging or discharging of the battery which might change the result.

According to another aspect of the invention there is provided a power management system which comprises: a control unit; a main battery; and an auxiliary battery. The control unit is arranged to estimate the state of charge of the auxiliary battery using a method as described above. The control unit may be an existing power supply control unit. In this way, the invention can be implemented on an existing hardware platform, without the need for additional components.

It may be that the control unit comprises a memory, and the memory comprises a table which relates the difference between $I_1$ and $I_2$ with the state of charge in the auxiliary battery.

Alternatively, the memory may comprise an equation which relates the difference between $I_1$ and $I_2$ with the state of charge in the auxiliary battery.

It may be that the control unit is arranged to calibrating the table or equation using a method as described above.

The invention also provides a vehicle which employs a method as described above and/or comprises a power management system as described above.

The invention thus provides a vehicle comprising an electrical load and main and auxiliary batteries independently connectible by a control unit to the electrical load and means to measure the current (I) drawn by the electrical load from the main battery, wherein the control unit is arranged to connect the main battery to the electrical load, determine $I_1$, the current drawn from the main battery while it is connected to the electrical load, connect the auxiliary battery in parallel with the main battery to the electrical load, measure $I_2$, the current drawn from the main battery while it is connected to the electrical load and the auxiliary battery, and estimate the state of charge in the auxiliary battery based upon at least the difference between $I_1$ and $I_2$.

In an embodiment, the vehicle incorporates an internal combustion engine and has a stop start mode of operation whereby the main battery is employed to start the engine and operate the vehicle electrical load while the engine is running and the auxiliary battery is employed to operate the vehicle electrical load while the engine is being started by the main battery during said stop start mode of operation, wherein said control unit is arranged to estimate the state of charge of the auxiliary battery while the engine is running. The vehicle may be a hybrid electric vehicle. Where the vehicle is a hybrid electric vehicle, the auxiliary battery may be used while in any electric vehicle mode.

The control unit of the vehicle may be arranged to perform the method steps described above.

Within the scope of this application it is expressly envisaged that the various aspects, embodiments, examples and alternatives set out in the preceding paragraphs, in the claims and/or in the following description and drawings, and in particular the individual features thereof, may be taken independently or in any combination. Features described in connection with one embodiment are applicable to all embodiments, unless such features are incompatible.

BRIEF DESCRIPTION OF THE DRAWINGS

One or more embodiments of the invention will now be described hereinafter with reference to the accompanying drawings, in which.

DETAILED DESCRIPTION

Figure 1:
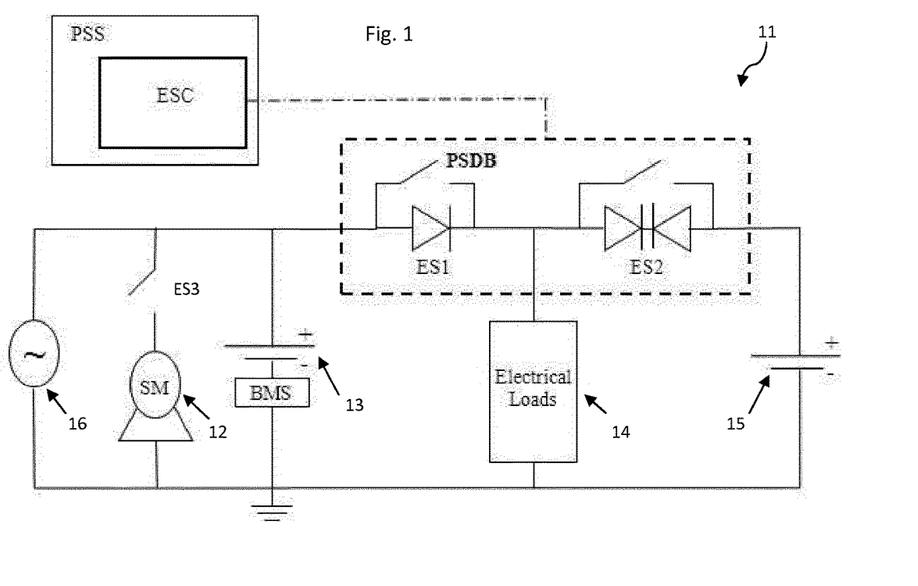
FIG. 1 is a diagram of part of the electrical system in a car.
Figure 2:
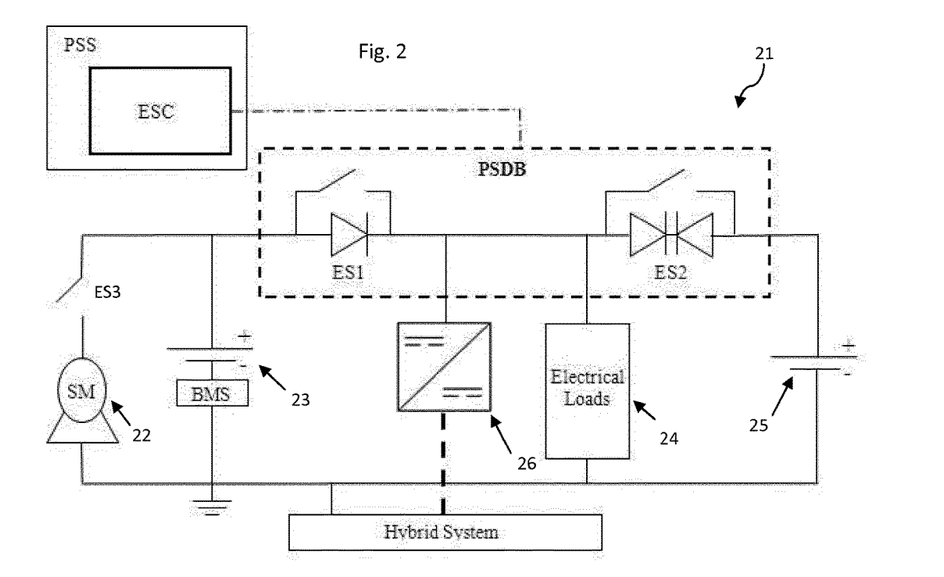
FIG. 2 is a diagram of part of the electrical system in a hybrid car.

FIG. 1 and FIG. 2 are diagrams of the electrical systems in two different types of vehicle. FIG. 1 shows the electrical system 11 in a conventional car which is equipped with a stop start system. FIG. 2 shows the electrical system 21 in a hybrid car. Both the conventional car and the hybrid comprise a starter motor 12, 22, a main battery 13, 23, various loads such as the engine management system, windscreen wipers etc 14, 24, and an auxiliary battery 15, 25, all of which are arranged in parallel. Both of the main batteries 13, 23 are provided with Battery Monitoring Systems (BMS). The conventional car comprises an alternator 16, which can provide power to the system when the internal combustion engine is running. The hybrid car comprises a DC/DC converter 26 which receives power from the electric motor/generator (not shown) and a high voltage battery (not shown). The DC/DC convertor 26 charges the batteries 23, 25. Each system also comprises three switches, ES1, ES2 and ES3, which can be used to isolate components from one another when necessary.

Although the conventional car and the hybrid car are equipped with similar dual battery power supply systems, the operation of the switches ES1, ES2 and ES3 and the use of auxiliary batteries 15, 25 are very different. Although the hybrid car can stop and start the engine to save fuel, it is also equipped with an electric motor suitable for propelling the vehicle at low speeds. Also, the DC/DC converter 26 is capable of supporting the electrical loads 24 while the internal combustion engine of the hybrid car is turned off, which an alternator 16 cannot do.

Both the main and auxiliary batteries 13, 23, 15, 25 are typically 12V lead acid batteries.

After the auxiliary battery 15, 25 has been at rest for a long period of time its SOC can be estimated by measuring the voltage across the battery's terminals. Hence when the car has been turned off for over eight hours, the SOC of the auxiliary battery 15, 25, can be measured directly by a simple voltage measurement. This is known as the passive test.

However, a passive test is of no use while the battery has been recently charged or discharged, since charging and discharging cause a diffusion of the electrolyte, which in turn prevents the voltage from providing a reliable indication of the charge. Therefore, when the vehicle off time is too short to use the voltage which is measured at the battery terminals to estimate the SOC, an alternative method must be employed.

One method uses the current of the auxiliary battery, rather than the voltage, to estimate the auxiliary battery's state of charge. This is known as the active test.

Figure 3:
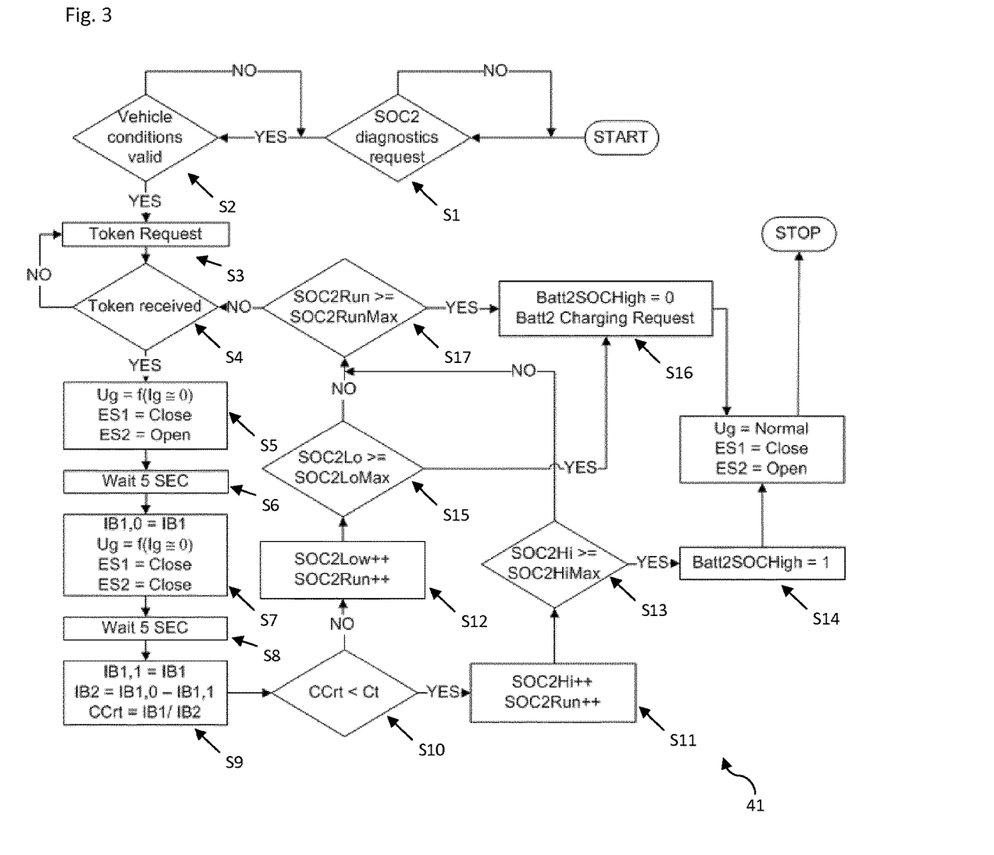
FIG. 3 is a flow chart showing a method of determining and maintaining the state of charge in a vehicle.

FIG. 3 is a flow chart 41 showing the active test, which is a process which might be used by the power management system in a vehicle as shown in FIG. 1 to estimate the SOC of the auxiliary battery 15. (The same approach is taken with respect to FIG. 2, but the following description refers only to FIG. 1 unless specified otherwise.)

In a first step S1, the power management system determines that such a test is necessary and submits a request for the test to be carried out. The request is submitted to a switch control unit within the power management system which controls the arrangement of the switches ES1, ES2, and therefore controls whether the vehicle can be put into the correct state for carrying out the test. In step S2, the switch control unit checks that the conditions are valid for a test to be carried out. If they are valid, then the test proceeds. In steps S3 and S4 a token is issued. The token represents permission for the test to proceed.

Then the alternator 16 is set to a minimal output, usually providing between one and two amps of current, by minimising the excitation current for the magnetic field in the alternator. Although this is not noted in the flow chart, this step is helpful since it increases the current which is subsequently drawn from the batteries, which tends to lead to a more reliable measurement of the charge in the auxiliary battery 15. In step S5, ES1 is closed and ES2 is opened. In this configuration, the main battery 13 is providing all the power for the load 14. As the current is subject to sudden change after the switches are operated, the power management system then waits five seconds (step S6). The power management system then uses the BMS to measure IB1, which is the current being produced by the main battery 13 at this stage. This measurement is recorded as IB1,0.

In step S7, ES2 is closed, so that both the main battery 13 and the auxiliary battery 15 are connected to the load 14. Again, the power management system waits five seconds (step S8) before measuring IB1 again. This measurement is recorded as IB1,1.

The current contributed by the auxiliary battery, IB2, can then be calculated as:

$$IB2=IB1,0-IB1,1$$

If IB2 is negative, this indicates that the current being drawn from the main battery 13 was reduced when the auxiliary battery 15 was connected. As such, the auxiliary battery 15 has a high enough capacity to contribute usefully to the load.

If IB2 is positive, then this indicates that the current being drawn from the main battery 13 was increased when the auxiliary battery 15 was connected. As such, the auxiliary battery 15 does not have a high enough capacity to contribute usefully to the load.

For example, in steps S5 and S6, when I_LOAD (the current drawn by the load) is 40A and I_GEN (the current generated by the alternator) is 0A, then IB1,0=−40A. Then, when ES2 is closed, the change in IB1 depends on the state of charge of the auxiliary battery. If IB1 drops from −40A to −60A then IB2=−40A−(−60A)=−20A, which indicates that the auxiliary battery is drawing current from the main battery and charging. Alternatively, if IB1 increases from −40A to −20A, then IB2=−40A−(−20A)=−20A, which indicates that the auxiliary battery is discharging.

As such, IB2 is related to the SOC of the auxiliary battery 15, as well as the SOC of the main battery.

However, IB2 also varies depending upon the SOC of the main battery 13. Therefore the power management system calculates the ratio of the currents contributed by the main and auxiliary batteries 13, 15 in step S9. This gives the current contribution ratio, CCrt, which is defined as:

$$CCrt=IB1,1/IB2$$

In step S10, the power management system then compares the ratio CCrt to a threshold ratio Ct. If CCrt is greater than or equal to Ct then this indicates that the state of charge in the auxiliary battery 15 is too low. If CCrt is lower than or equal to Ct, then this indicates that the state of charge in the auxiliary battery 15 is adequate.

The value of Ct depends upon the size of the main battery 13 and the size of the auxiliary battery 15. However these are fixed variables and can be taken into account when designing the car and calibrating the power management system. More problematically, the ideal value for Ct also depends upon the temperature of the main and auxiliary batteries 13, 15. In particular, the internal resistance of each battery increases as the temperature of the electrolyte decreases. Therefore CCrt is related to the state of charge and the temperature of both batteries. As such Ct is variable with respect to the temperature of the batteries 13, 15.

The BMS can provide a temperature for the main battery. The temperature of the auxiliary battery can either be provided by a dedicated temperature sensor or inferred from other known facts about the car.

For example, in the embodiment shown in FIG. 1, the auxiliary battery 15 may be located next to the main battery 13 under the bonnet of the vehicle. As such, the temperature of the main battery 13 serves as an estimated value for the temperature of the auxiliary battery 15. In other designs of vehicle a more complicated calculation may need to be made, based for example on the ambient temperature, the location of the battery in the car, and how long the car has been running.

Once the two temperatures are determined, the appropriate value for Ct can be determined using a map relating temperatures to Ct for batteries with the known characteristics of the main battery 13 and the auxiliary battery 15. This map can be derived, for example, by testing the main battery 13 and the auxiliary battery 15, or other batteries with the same characteristics, at a range of different temperatures and determining the relationship between temperature and the performance of the batteries.

The load 14 in an electrical system such as the one shown in FIG. 1 is subject to change over time. For example, while the power management system is performing the process shown in FIG. 3, the driver may activate heated seats, or heating for the front or rear windscreen, both of which can change the load significantly.

To take account of this source of error, the power management system performs the check several times. As is shown at steps S11 and S12 in FIG. 4, each time the test is run, the power management system increments the counter SOC2 High if CCrt<Ct, and increments the counter SOC2Low if CCrt≥Ct.

Once SOC2High reaches the threshold SOC2HighMax (step S13), this is taken as an indication that the battery is sufficiently charged (step S14). In the example given, the target SOC is an 80% charge, and SOC2HighMax is 3. Therefore, once the power management system receives three cumulative results indicating that the auxiliary battery 15 has at least an 80% charge, it is taken that the auxiliary battery 15 is charged and ready for use.

Similarly, once SOC2Low reaches the threshold SOC2LowMax (step S15), this is taken as an indication that the battery is not sufficiently charged (step S16). In the example given, SOC2LowMax is 3. Therefore, once the power management system receives three cumulative results indicating that the auxiliary battery 15 has less than an 80% charge, it is taken that the auxiliary battery 15 needs to be charged. To charge the auxiliary battery, the alternator 16 is reactivated and connected to the auxiliary battery 15.

The power management system also increments a counter SOC2Run each time CCrt is measured (steps S11 and S12). If SOC2Run exceeds the threshold SOC2RunMax this is also taken as an indication that the battery is not sufficiently charged (step S17).

During the active test, the power management system monitors which other systems are active in the vehicle. If it appears that the load 14 will rise higher than can be safely supplied by the main and auxiliary batteries 13, 15, then the power management system interrupts the active test and reactivates the alternator 16.

The power management system also monitors the state of charge of the main battery 13 during the test. If the state of charge of the main battery 13 falls below a safety threshold, then the test is interrupted and the alternator is used to support the loads. The test can then be re-initialised one the state of charge of the main battery 13 is high again.

Turning to FIG. 2, the auxiliary battery 25 in this figure can be monitored using the method outlined above. The only difference is that it is the DC/DC Converter 26 which is turned off, by setting the duty cycle, rather than an alternator 16.

The power management system in a vehicle can initiate a check of the SOC in the auxiliary battery 15, 25 for a number of reasons. For example, the power management system may be configured to carry out a check after a predetermined period of time has passed since the last such check. Also, the power management system may be configured to perform a check immediately after the auxiliary battery 15, 25 has undergone a charging cycle. In this way the power management system can confirm that the auxiliary battery 15, 25 has been successfully charged.

If a check is performed after a charging cycle, and the auxiliary battery 15, 25 is found not to be charged, then the power management system records this as an unsuccessful charging event and initiates a second charging cycle. This can happen if the load 14, 24 is high during the charging cycle, the load therefore drawing enough current to prevent an effective charging of the auxiliary battery 15, 25. However, an unsuccessful charging cycle can also indicate that the auxiliary battery needs to be serviced or replaced, especially if there are several unsuccessful charging cycles in a row. To this end, the power management system keeps a log of unsuccessful and successful charging events for use in servicing the car. If the number of unsuccessful charging events exceeds a minimum threshold, then a message is displayed to the driver recommending that the auxiliary battery 15, 25 be checked.

Typically a certain minimum load 14, 24 is required to ensure that the power management system can accurately estimate the SOC of the auxiliary battery 15, 25. As such, if the load is too small the power management system may delay estimating the SOC until the load has risen above a predetermined minimum. In an alternative embodiment, if the load is too small then the power management system may activate other power consuming systems in order to raise the load 14, 24 during a test cycle. However this would be unusual, since typically the required load for an accurate estimate of the SOC of the auxiliary battery 15, 25 is close to the engine's base load, that is the minimum load that the engine can create while operational.

The power management system can perform a correction of the estimated state of charge in the auxiliary battery 15, 25 if the car has been turned off for a long enough period of time, typically eight hours. To perform the correction, the power management system performs a passive test, by measuring the voltage across the terminals of the auxiliary battery 15, 25. The power management system then compares the result of the passive test with the last known result of the active test, and uses the result of the passive test if there is any disagreement.

In a further embodiment, the power management system can perform a calibration check if the car has been turned off for a long enough period of time. To perform the calibration check, the power management system first performs a passive test, by measuring the voltage across the terminals of the auxiliary battery 15, 25. The power management system then performs an active test, by disconnecting and connecting the batteries as described above. The passive test is performed first so that the results are not distorted by the discharging which occurs during the active test. The power management system then compares the results of the two tests and calibrates the active test according to the results of the passive test.

As such, the power management system can adapt if the characteristics of the main and auxiliary batteries 13, 23, 15, 25 change as they age.

The description above relates to a method of determining the state of charge of an auxiliary battery. However the method could also be used to determine the state of charge of a main battery if, for example the auxiliary battery was provided with a battery monitoring system.

Similarly, the method described above uses a plurality of sets of measurements of current to derive an estimate of a state of charge. However only one set of measurements can be used if this is preferred. Furthermore the state of charge can be estimate using other methods than calculating a current contribution ratio C, for example by comparing the measured currents $I_1$ and $I_2$ to a database which directly relates the measured values of current to an expected state of charge of the battery.

The method described above may be carried out by a power management system. Alternatively, the method may be carried out by some other system within the vehicle, or by an external system attached to the vehicle, for example during maintenance.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The invention claimed is:

1. A method for determining the state of charge in a battery, the method comprising:
    connecting a main battery to an electrical load;
    measuring $I_1$, which is current drawn from the main battery while it is connected to the electrical load;
    connecting an auxiliary battery in parallel with the main battery and the electrical load;
    measuring $I_2$, which is current drawn from the main battery while it is connected to the electrical load and the auxiliary battery; and
    estimating a state of charge in the auxiliary battery based upon a difference between the measured $I_1$ and the measured $I_2$.

2. The method of claim 1, further comprising:
    taking a plurality of measurements of $I_1$ and $I_2$; and
    deriving a plurality of estimates of the state of charge in the auxiliary battery using the plurality of measurements of $I_1$ and $I_2$.

3. The method of claim 1, further comprising:
    determining a temperature of the main battery; and
    estimating the state of charge in the auxiliary battery based upon at least the difference between $I_1$ and $I_2$, and the temperature of the main battery.

4. The method of claim 1, further comprising:
    determining a temperature of the auxiliary battery; and
    estimating the state of charge in the auxiliary battery based upon at least the difference between $I_1$ and $I_2$, and the temperature of the auxiliary battery.

5. The method of claim 1, further comprising:
    initiating a charging cycle for the auxiliary battery if the estimated state of charge in the auxiliary battery is beneath a predetermined level.

6. The method of claim 1, further comprising:
    determining a size of the electrical load; and
    in dependence on the size of the electrical load being beneath a predetermined threshold, interrupting the method of claim 1 until the size of the electrical load has risen above the predetermined threshold.

7. The method of claim 1, further comprising:
    determining a size of the electrical load; and
    in dependence on the size of the electrical load exceeding a predetermined maximum, interrupting the method of claim 1.

8. The method of claim 1, further comprising:
    calculating a current contribution ratio C, where $C=I_2/(I_1-I_2)$; and
    estimating the state of charge in the auxiliary battery based upon at least the value of C.

9. The method of claim 8, wherein estimating the state of charge in the auxiliary battery comprises comparing C to a threshold value of C.

10. The method of claim 1, further comprising:
    providing a table which relates the difference between $I_1$ and $I_2$ with a state of charge in the auxiliary battery; and
    using the table to estimate the state of charge in the auxiliary battery.

11. The method of claim 10, comprising calibrating the table by:
    not charging or discharging the auxiliary battery for a predetermined period of time; measuring a voltage across terminals of the auxiliary battery;
    estimating the state of charge in the auxiliary battery based upon a voltage across the terminals;
    comparing the estimate of the state of charge of the auxiliary battery based upon the voltage across the terminals with the estimate of the state of charge of the auxiliary battery based upon the difference between the measured $I_1$ and the measured $I_2$; and
    amending the table so that the two estimates are the same.

12. A power management system comprising:
    a control unit;
    a main battery; and
    an auxiliary battery,
    the control unit configured to estimate a state of charge of the auxiliary battery using the method of claim 1.

13. A vehicle comprising the power management system of claim 12.

14. A vehicle comprising a control unit configured to perform the method of claim 1.

15. A vehicle comprising an electrical load and main and auxiliary batteries independently connectible by a control unit to the electrical load and at least one battery monitoring system configured to measure current (I) drawn by the electrical load from the main battery, wherein the control unit is configured to:
    connect the main battery to the electrical load,
    determine $I_1$, which is current drawn from the main battery while it is connected to the electrical load,
    connect the auxiliary battery in parallel with the main battery to the electrical load,
    measure $I_2$, which is current drawn from the main battery while it is connected to the electrical load and the auxiliary battery, and
    estimate a state of charge in the auxiliary battery based upon at least the difference between $I_1$ and $I_2$.

16. The vehicle of claim 15, wherein the vehicle incorporates an internal combustion engine and has a stop start mode of operation whereby the main battery is employed to start the engine and operate the vehicle electrical load while the engine is running and the auxiliary battery is employed to operate the vehicle electrical load while the engine is being started by the main battery during said stop start mode of operation, wherein said control unit is arranged to estimate the state of charge of the auxiliary battery while the engine is running.

* * * * *

UNITED STATES PATENT AND TRADEMARK OFFICE
CERTIFICATE OF CORRECTION

PATENT NO. : 10,150,460 B2
APPLICATION NO. : 14/426200
DATED : December 11, 2018
INVENTOR(S) : Slosarczyk et al.

It is certified that error appears in the above-identified patent and that said Letters Patent is hereby corrected as shown below:

On the Title Page

Item (56) References Cited, FOREIGN PATENT DOCUMENTS, Page 2:
Please correct "JP 2010-036280" to read -- JP 2010-035280 --

In the Specification

Column 7, Line 63:
Please correct "IB2= -40A-(-60A)= -20A" to read -- IB2= -40A-(-60A)= 20A --

Signed and Sealed this
Nineteenth Day of March, 2019

Andrei Iancu
*Director of the United States Patent and Trademark Office*